United States Patent [19]

Anami et al.

[11] Patent Number: 4,879,690

[45] Date of Patent: Nov. 7, 1989

[54] STATIC RANDOM ACCESS MEMORY WITH REDUCED SOFT ERROR RATE

[75] Inventors: Kenji Anami; Katsuki Ichinose; Tomohisa Wada, all of Hyogo, Japan

[73] Assignee: Mitsubishi Denki Kabushiki Kaisha, Tokyo, Japan

[21] Appl. No.: 231,063

[22] Filed: Aug. 11, 1988

[30] Foreign Application Priority Data

Sep. 7, 1987 [JP] Japan .................... 62-223299
Sep. 25, 1987 [JP] Japan .................... 62-242308
Jun. 10, 1988 [JP] Japan .................... 63-144320

[51] Int. Cl.[4] .................................................. G11C 13/00
[52] U.S. Cl. ...................................... 365/201; 365/203; 365/189.07; 371/21.1
[58] Field of Search ............... 365/53, 182, 189, 190, 365/201, 203, 202, 206; 371/21, 38, 51

[56] References Cited

U.S. PATENT DOCUMENTS 4,811,294 3/1989 Kobayashi et al. ................ 365/201

FOREIGN PATENT DOCUMENTS 18997 4/1987 Japan .

OTHER PUBLICATIONS

Jap. J. of Appl. Phys: "Soft Error Analysis of Fully Static MOS Ram", by Masahiko Yaoshimoto et al., vol. 22 (1983), Supplement 22-1, pp. 69-73.

IEEE J. of Sol. St. Circuits: "Influences on Sift Error Rates in Static Ram's", by Paul M. Carter et al., vol. SC-22, No. 3, Jun. 1987, pp. 430-436.

Primary Examiner—Terrell W. Fears
Attorney, Agent, or Firm—Lowe, Price, LeBlanc, Becker & Shur

[57] ABSTRACT

A storage node in each of memory cells in a static RAM is connected to a bit line through an accessing MOSFET. The accessing MOSFET has its gate connected to a word line. A word line driver comprising a level shifting N channel MOSFET and a CMOS inverter is connected to the word line. At the time of selecting the word line, a potential which is lower, by a threshold voltage of the MOSFET, than a power-supply potential is applied to the word line. Thus, a sub-threshold current flowing in the MOSFET connected between the storage node for storing data at a high level and the bit line to which data of a high level is read out becomes substantially small, so that a potential of the storage node for storing data of a high level is not lowered.

22 Claims, 9 Drawing Sheets

STATIC RANDOM ACCESS MEMORY WITH REDUCED SOFT ERROR RATE

BACKGROUND OF THE INVENTION

1. Field of the Invention

The present invention relates to static random access memories and more particularly, to static random access memories having a reduced soft error rate.

2. Description of the Prior Art

FIG. 1 is a block diagram showing an example of structure of a static random access memory (referred to as a static RAM hereinafter).

In FIG. 1, a plurality of word lines and a plurality of bit line pairs are arranged intersecting with each other in a memory cell array 50, memory cells being provided at intersections of the word lines and the bit line pairs, respectively. The word lines in the memory cell array 50 are connected to an X decoder 51. X address signals are applied to the X decoder 51 through an X address buffer 52. In addition, the bit line pairs in the memory cell array 50 are connected to a Y decoder 54 through a transfer gate 53. Y address signals are applied to the Y decoder 54 through a Y address buffer 55.

One of the word lines in the memory cell array 50 is selected by the X address decoder 51 in response to the X address signals and one set of the bit line pairs in the memory cell array 50 is selected by the Y address decoder 54 in response to the Y address signals, so that a memory cell provided at an intersection of the selected word line and the selected bit line pair is selected. Data is written into the selected memory cell or data stored in the memory cell is read out. Writing or reading of data is selected by a read/write control signal R/W applied to a read/write control circuit 56. At the time of writing data, input data $D_{in}$ is inputted to the selected memory cell through a data input buffer 57. In addition, at the time of reading out data, data stored in the selected memory cell is extracted to the exterior through a sense amplifier 58 and a data output buffer 59.

FIG. 2 is a circuit diagram of a memory cell portion in a conventional static RAM which is disclosed in, for example, Japanese Patent Publication No. 18997/1987.

In FIG. 2, a plurality of memory cells 1a to 1n are connected between bit lines 14 and 15. Each of the memory cells 1a to 1n comprises two inverter constituting MOS field effect transistors (referred to as MOS-FETs hereinafter) 2 and 3 of enhancement type, two load resistances 4 and 5 each having a high resistance value and two accessing MOSFETs 6 and 7. The MOS-FETs 2 and 3 have respective their drains D connected to respective one ends of the resistances 4 and 5 at nodes 8 and 9, respectively, the respective other ends of the resistances 4 and 5 being connected to power supply terminals 10 and 11, respectively. In addition, each of the MOSFETs 2 and 3 has its source S connected to a ground terminal. Furthermore, the MOSFET 2 has its gate G connected to the node 9 and the MOSFET 3 has its gate G connected to the node 8. Information is stored in a parasitic capacitance 12 which exists between the node 8 and the ground terminal and a parasitic capacitance 13 which exists between the node 9 and the ground terminal. The node 8 is connected to the bit line 14 through the accessing MOSFET 6. The MOSFET 6 has its gate connected to a corresponding one of word lines 16a to 16n. The node 9 is connected to the bit line 15 through the accessing MOSFET 7. The MOSFET 7 has its gate connected to a corresponding one of the word lines 16a to 16n.

The bit lines 14 and 15 are connected to I/O lines 19 and 20 through MOSFETs 17 and 18, respectively. Each of the MOSFETs 17 and 18 has its gate connected to an input terminal 21 receiving a column selecting signal by a Y decoder. In addition, the bit lines 14 and 15 are connected to power supply terminals 24 and 25 through bit line load constituting MOSFETs 22 and 23 which have a diode-connection, respectively. The MOSFETs 22 and 23 precharge the bit lines 14 and 15, respectively. A power-supply voltage $V_{CC}$ is applied to the power supply terminals 10, 11, 24 and 25.

A threshold voltage $V_{THD}$ of the inverter constituting MOSFETs 2 and 3 is set to be higher than a threshold voltage $V_{TH}$ of the other MOSFETs in the memory circuit. In addition, assuming that an on-resistance at the operating time of the MOSFETs 2 and 3 is represented by $R_{DON}$, an on-resistance at the operating time of the MOSFETs 6 and 7 is represented by $R_{TON}$ and an on-resistance at the operating time of the MOSFETs 22 and 23 is represented by $R_{LON}$, the threshold voltage $V_{THD}$ of the inverter constituting MOSFETs 2 and 3 is set as follows:

$$V_{RL} = \frac{R_{DON} \cdot V_{CC}}{R_{DON} + R_{TON} + R_{LON}} \leq V_{THD} \qquad (1)$$

Where $V_{RL}$ represents a potential of the node 8 or 9 which stores data at a low level at the time of selecting the word lines.

Operation of the memory cell is now described.

It is assumed that data stored in the memory cell 1a is read out with the potential of the node 8 in the memory cell 1a being at a low level and the potential of the node 9 therein being at a high level. In this case, a potential on the word line 16a changes from 0V or a potential close to 0V at the time of non-selecting a word line to the power-supply potential $V_{CC}$ or a potential close to $V_{CC}$ at the time of selecting a word line. As a result, a current flows from the power supply terminal 24 to the ground terminal through the bit line load constituting MOSFET 22, the accessing MOSFET 6 and the inverter constituting MOSFET 2. However, since the inverter constituting MOSFET 3 is turned off, no current flows from the power supply terminal 25 to the ground terminal through the bit line load constituting MOSFET 23, the accessing MOSFET 7 and the inverter constituting MOSFET 3. Thus, a potential on the bit line 14 is set to a potential determined by the ratio of the on-resistances of the MOSFET 22, the MOSFET 6 and the MOSFET 2, while a potential on the bit line 15 is set to a potential which is lower, by the threshold voltage $V_{TH}$ of the bit line load constituting MOSFET 23, than the power-supply potential $V_{CC}$.

In the above described conventional static RAM, since at the time of reading out data, the potential on the word line 16a is the power-supply potential $V_{CC}$ and the potential on the bit line 15 is lower, by the threshold voltage $V_{TH}$ of the MOSFET 23, than the power-supply potential $V_{CC}$, a voltage between a gate and a source (which is connected to a bit line) of the accessing MOSFET 7 almost equals the absolute value of the threshold voltage $V_{TH}$ of the accessing MOSFET 7. Therefore, a sub-threshold current $I_{subA}$ flows in the accessing MOSFET 7, so that charges flow to the bit line 15 from the node 9 having the power-supply potential $V_{CC}$ stored therein. Thus, in the conventional static RAM, the potential at the time of storing data of a high level is lowered, so that soft errors are liable to occur.

Description is now made on soft errors in the RAM. Soft errors mean that information stored in a memory cell is lost by disturbance such as noise so that information "1" is inverted into information "0" or information "0" is inverted into information "1". Namely, soft errors mean that information is only inverted. More specifically, soft errors do not mean that structure of the memory cell is destroyed physically but that the state of a flip-flop in the memory cell only changes. Thus, when correct information is written to the memory cell, the correct information is stored therein. On the other hand, hard errors mean that a memory cell is destroyed physically so that information can not be stored therein any longer.

The problem to be considered in the present invention is soft errors generated by alpha particles, of soft errors. FIG. 3 is a cross sectional view showing a single storage node of the memory cell. In FIG. 3, upon incidence of alpha particles on an n+layer 101 serving as a storage node of the memory cell or the vicinity thereof from exterior, electron and hole pairs are generated in a semiconductor substrate (P-well 102 herein) by energy thereof. Electrons, of the electron and hole pairs are attracted to the n+ layer 101 serving as a storage node. As a result, a potential of the storage node is lowered. When information at a high level is stored in the storage node, the information stored therein is inverted if the potential thereof is too lowered. Consequently, soft errors occur. Thus, when a potential of a node which stores information at a high level is lowered to some degree, soft errors are liable to occur.

Various research papers concerning soft errors in a static RAM have been presented. For example, an article in Japanese Journal of Applied Physics, Vol. 22, Supplement 22-1, 1983, pp. 69-73 shows that a soft error rate of an SRAM depends on a selected time interval of a memory cell. An article in IEEE Journal of Solid-State Circuits, Vol. SC-22, No. 3, June 1987, pp. 430-436 shows that since a memory cell in an SRAM requires several 10 μs until a potential of a node of a high level is recovered after data is read out from the memory cell, a soft error rate is increased if the memory cell is operated in a cycle of several 10 μs or less.

SUMMARY OF THE INVENTION

An object of the present invention is to provide a static RAM which is immune to soft errors.

Another object of the present invention is to prevent the decrease in potential of a node which stores data at a high level in a static RAM.

Still another object of the present invention is to reduce a soft error rate in a static RAM without increasing an areas of a memory cell.

Yet still another object of the present invention is to reduce a soft error rate in a static RAM without increasing complexing.

In order to attain the above described objects, the static RAM according to the present invention comprises a plurality of word lines, a plurality of pairs of bit lines arranged intersecting with the plurality of word lines, a plurality of memory cells each connected to an intersection of each of the word lines and each of the bit line pairs, a potential source for generating a power-supply potential and a ground potential, and word line selecting means for selecting a single word line of the plurality of word lines and applying a predetermined potential to the word line. Each of the memory cells comprising a first load element, a second load element, a first information storing transistor element, a second information storing transistor element, a third accessing transistor element, and a fourth accessing transistor element. The first load element has one terminal coupled to the power-supply potential and another terminal in which information of a low or high level is stored. The second load element has one terminal coupled to the power-supply potential and another terminal in which information of a high or low level is stored. The first information storing transistor element is connected between the other terminal of the first load element and the ground potential and has a control terminal connected to the other terminal of the second load element. The second information storing transistor element is connected between the other terminal of the second load element and the ground potential and has a control terminal connected to the other terminal of the first load element. The third accessing transistor element is connected between one of each of the bit line pairs and the other terminal of the first load element and has a control terminal connected to the word line. The fourth accessing transistor element is connected between the other of each of the bit line pairs and the other terminal of the second load element and has a control terminal connected to the word line. The third and fourth accessing transistor elements have a first threshold voltage. The difference between the predetermined potential applied by the word line selecting means and a potential on the bit line to which information at a high level is read out at the time of selecting the word line being smaller than a first threshold voltage of the third or fourth transistor element.

In the static RAM according to the present invention, since the difference between the potential on the word line and the potential on the bit line to which information of a high level is read out becomes smaller than the threshold voltage of the third or fourth transistor element, a sub-threshold current flowing in the third or fourth transistor element becomes substantially small.

In accordance with another aspect of the present invention, the first transistor element and the second transistor element have a second threshold voltage which is larger than a voltage between a potential of the other terminal of the first or second load element having information at a low level stored therein at the time of selecting the word line and the ground potential. Therefore, at the time of selecting the word line, a sub-threshold current flowing in the first or second transistor element having information at a high level stored therein becomes substantially small. Thus, the decrease in potential of a node having information of a high level stored therein is prevented, so that a static RAM which is immune to soft errors is obtained with high reliability.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 4:
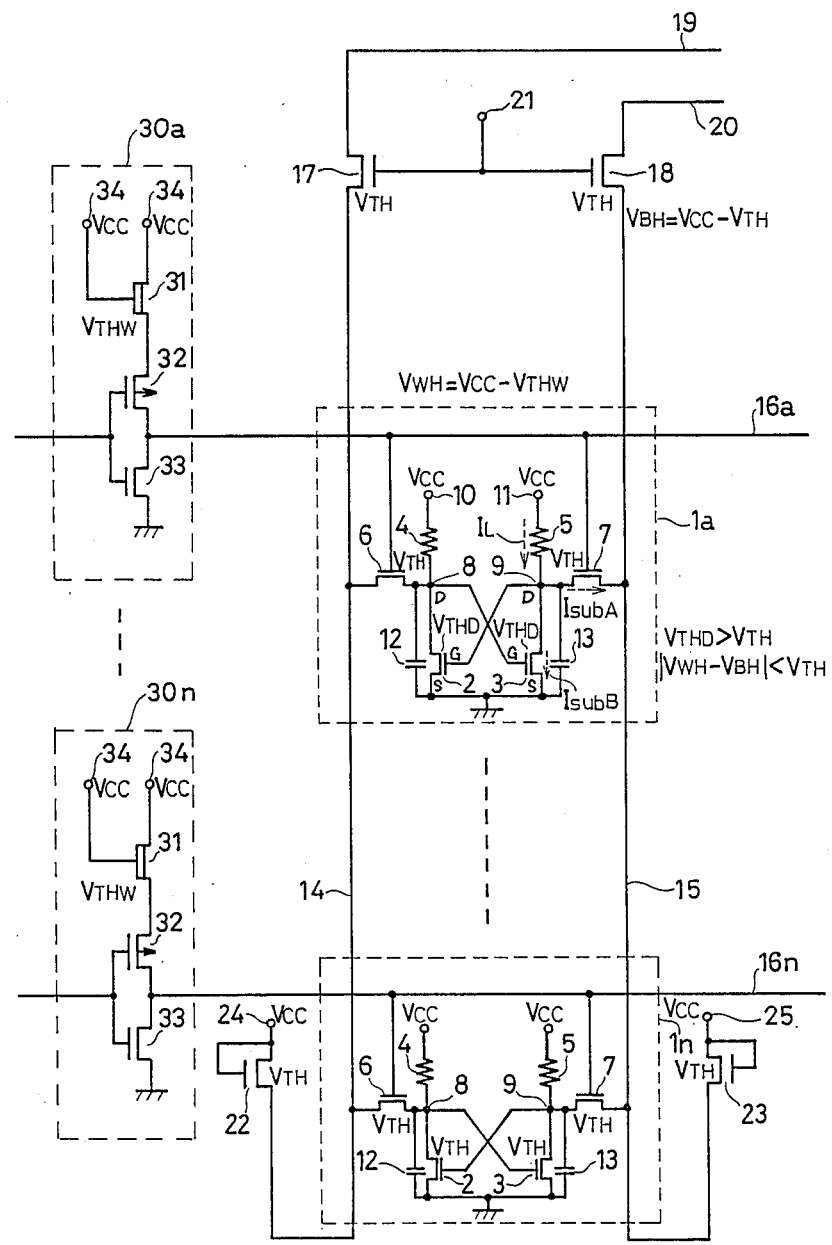
FIG. 4 is a circuit diagram showing a memory cell portion of a static RAM according to an embodiment of the present invention.

FIG. 4 is a circuit diagram showing a memory cell portion of a static RAM according to an embodiment of the present invention.

In FIG. 4, a plurality of memory cells 1a to 1n are connected between a pair of bit lines 14 and 15. Each of the memory cells 1a to 1n comprises two inverter constituting MOSFETs 2 and 3 of an enhancement type, two load resistances 4 and 5 each having a high resistance value and two accessing MOSFETs 6 and 7. The MOSFETs 2 and 3 have respective drains D connected to respective one ends of the resistances 4 and 5 at nodes 8 and 9, respectively, respective other ends of the resistances 4 and 5 being connected to power supply terminals 10 and 11. In addition, each of the MOSFETs 2 and 3 has its source S connected to a ground terminal. Furthermore, the MOSFET 2 has its gate G connected to the node 9, and the MOSFET 3 has its gate G connected to the node 8. Information is stored in a parasitic capacitance 12 which exists between the node 8 and the ground terminal and a parasitic capacitance 13 which exists between the node 9 and the ground terminal. The node 8 is connected to the bit line 14 through the accessing MOSFET 6. The MOSFET 6 has its gate connected to a corresponding one of the word lines 16a to 16n. The node 9 is connected to the bit line 15 through the accessing MOSFET 7. The MOSFET 7 has its gate connected to a corresponding one of the word lines 16a to 16n.

The bit lines 14 and 15 are connected to I/O lines 19 and 20 through MOSFETs 17 and 18, respectively. Each of the MOSFETs 17 and 18 has its gate connected to an input terminal 21 receiving a column selecting signal. In addition, the bit lines 14 and 15 are connected to power supply terminals 24 and 25 through bit line load constituting MOSFETs 22 and 23 which have a diode-connection, respectively. The MOSFETs 22 and 23 precharge the bit lines 14 and 15, respectively. A power-supply voltage $V_{CC}$ is applied to the power supply terminals 10, 11, 24 and 25.

A threshold voltage $V_{THD}$ of the inverter constituting MOSFETs 2 and 3 is set to be higher than a threshold voltage $V_{TH}$ of the other MOSFETs in the memory circuit. In addition, assuming that an on-resistance at the operating time of the MOSFETs 2 and 3 is represented by $R_{DON}$, an on-resistance at the operating time of the MOSFETs 6 and 7 is represented by $R_{TON}$ and an on-resistance at the operating time of the MOSFETs 22 and 23 is represented by $R_{LON}$, the threshold voltage $V_{THD}$ of the inverter constituting MOSFETs 2 and 3 is set as follows:

$$V_{RL} = \frac{R_{DON} \cdot V_{CC}}{R_{DON} + R_{TON} + R_{LON}} \leq V_{THD} \quad (2)$$

where $V_{RL}$ represents a potential of the node 8 or 9 which stores data at a low level at the time of selecting the word lines.

Word line drivers 30a to 30n are connected to the word lines 16a to 16n, respectively. Each of the word line drivers 30a to 30n comprises a level shifting N channel MOSFET 31, a P channel MOSFET 32 and an N channel MOSFET 33. The MOSFET 31 has its drain and its gate connected to a power supply terminal 34 receiving the power-supply potential $V_{CC}$, and a source connected to a source of the MOSFET 32. The MOSFET 32 has a drain connected to a drain of the MOSFET 33. The MOSFET 33 has its source connected to the ground terminal. Each of the MOSFETs 32 and 33 has its gate receiving a word line selecting signal. A node of the drains of the MOSFETs 32 and 33 is connected to a corresponding one of the word lines 16a to 16n. The MOSFETs 32 and 33 constitute a CMOS inverter.

Operation of the memory cell is now described.

It is assumed that data stored in the memory cell 1a is read out when the node 8 in the memory cell 1a stores data at a low level and the node 9 stores data at a high level. When the word line selecting signal changes from an "H" level to an "L" level, a potential on the word line 16a becomes lower, by the threshold voltage $V_{THW}$ of the MOSFET 31, than the power-supply potential $V_{CC}$. As a result, the accessing MOSFET 6 is turned on, so that a current flows from the power supply terminal 24 to the ground terminal through the bit line load constituting MOSFET 22, the accessing MOSFET 6 and the inverter constituting MOSFET 2. At that time, a potential of the node 8 is $V_{RL}$ as shown in the equation (2). Since the threshold voltage $V_{THD}$ of the MOSFET 3 satisfies the relation $V_{RL} \leq V_{THD}$ the MOSFET 3 is not rendered conductive. As a result, no current flows from the power supply terminal 25 to the ground terminal through the bit line load constituting MOSFET 23, the accessing MOSFET 7 and the inverter constituting MOSFET 3, and a potential of the node 9 is not lowered from the power-supply potential $V_{CC}$.

Thus, a potential on the bit line 14 is set to a potential determined by the ratio of the on-resistances of the MOSFET 22, the MOSFET 6 and the MOSFET 2. A potential on the bit line 15 is set to a potential $V_{BH}$ which is lower, by the threshold voltage $V_{TH}$ of the bit line load constituting MOSFET 23, than the power-supply potential $V_{CC}$.

Furthermore, since the potential $V_{WH}$ on the word line 16a equals $V_{CC} - V_{THW}$ and the potential $V_{BH}$ on the bit line 15 equals $V_{CC} - V_{TH}$, a voltage between a gate and a source of the accessing MOSFET 7 becomes substantially small such as $|V_{THW} - V_{TH}|$. Therefore, the sum $I_{sub}$ of a sub-threshold current $I_{subA}$ flowing in the accessing MOSFET 7 and a sub-threshold current $I_{subB}$ flowing in the inverter constituting MOSFET 3 is sufficiently smaller than current ability $I_L$ supplied by the memory cell ($I_{sub} << I_L$). Thus, the potential of the node 9 is not lowered by the sub-threshold current $I_{sub}$.

On the other hand, it is assumed that data stored in the memory cell 1a is read out when the node 9 in the memory cell 1a stores data of a low level and the node 8 therein stores data of a high level. In this case, in the same manner, the potential on the bit line 14 is set to be lower, by the threshold voltage $V_{TH}$ of the bit line load constituting MOSFET 22, than the power-supply potential $V_{CC}$. In addition, the potential on the bit line 15 is set to a potential determined by the ratio of the on-resistances of the MOSFET 23, the MOSFET 7 and the MOSFET 3.

In this case, since $V_{THD}$ which is a threshold value of the MOSFET 2 satisfies the relation $V_{RL} \leq V_{THD}$ the MOSFET 2 is not rendered conductive. In addition, since the potential difference between a gate and a source of the accessing MOSFET 6 becomes substantially small, the sum $I_{sub}$ of the sub-threshold current $I_{subA}$ flowing in the MOSFET 6 and a sub-threshold current $I_{subB}$ flowing in the MOSFET 2 becomes sufficiently small. Thus, the potential of the node 8 is not lowered.

Thus, at the time of reading out data, since a potential of the storage node having data of a high level stored therein is not lowered from the power-supply potential $V_{CC}$, the static RAM is immune to soft errors.

Meanwhile, a threshold voltage of the MOSFET 31 is set by ion implantation, selection of the concentration of a substrate or the like in consideration of the value of a load resistance in a memory cell, so that the potential level at the time of selecting the word lines 16a to 16n can be freely set.

Although in the embodiment shown in FIG. 4, the level shifting MOSFET 31 is provided for every of the word line drivers 30a to 30n, a common level shifting MOSFET may be provided outside the word line drivers 30a to 30n.

Furthermore, although in the embodiment shown in FIG. 4, the MOSFET 31 which has a diode-connection is used for level shifting, a pn diode may be used, to obtain the same effect.

Additionally, although in the embodiment shown in FIG. 4, the gate of the level shifting MOSFET 31 is connected to the power-supply potential $V_{CC}$, the gate thereof may be connected to the other potentials which are set to a potential satisfying the relation $I_{sub} << I_L$ at the same time of selecting a word line.

Figure 5:
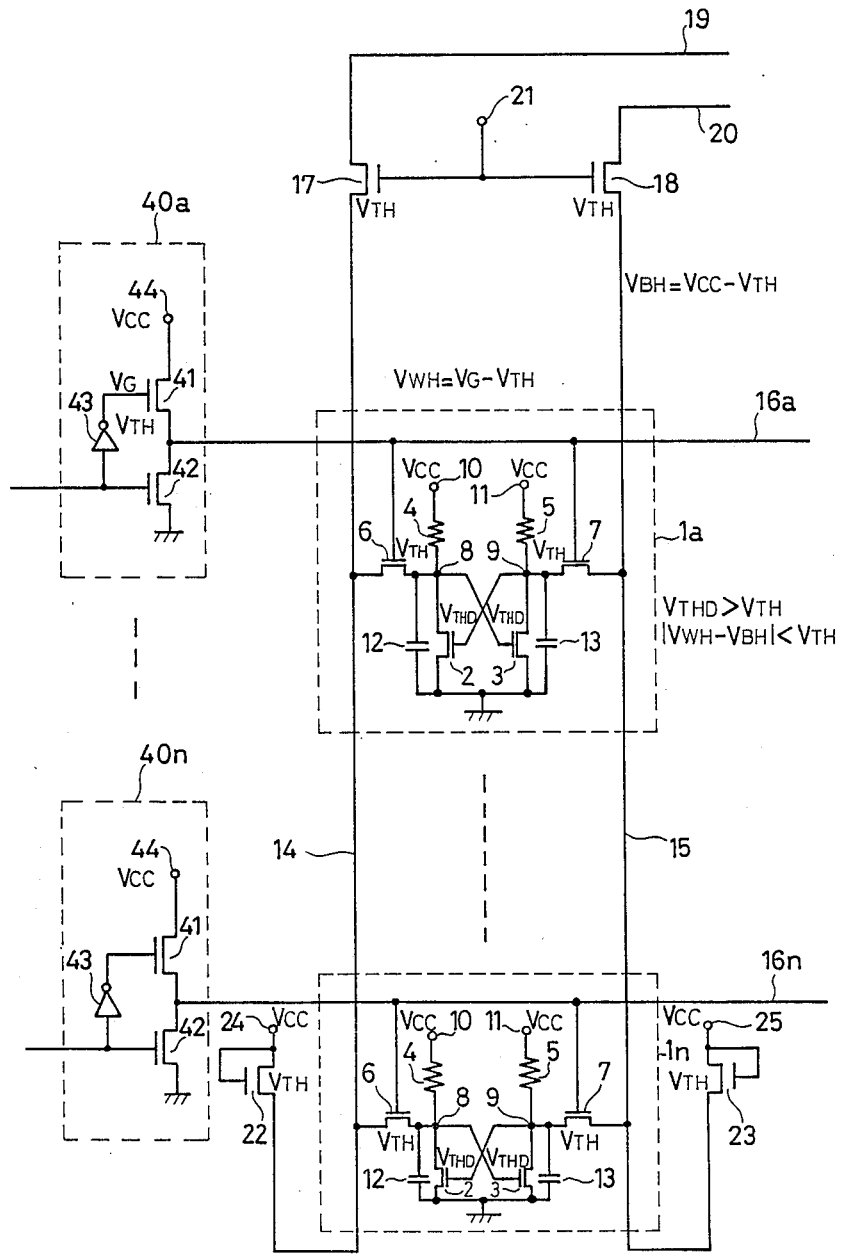
FIG. 5 is a circuit diagram showing a memory cell portion of a static RAM according to another embodiment of the present invention.

FIG. 5 is a circuit diagram showing a memory cell portion of a static RAM according to another embodiment of the present invention.

In FIG. 5, structure of memory cells 1a to 1n is the same as that of the memory cells 1a to 1n shown in FIG. 4, while structure of word line drivers 40a to 40n is different from that shown in FIG. 4.

Each of the word line drivers 40a to 40n comprises an N channel MOSFET 41, an N channel MOSFET 42 and an inverter 43. The MOSFET 41 has its drain connected to a power supply terminal 44 receiving a power-supply potential $V_{CC}$, and a source connected to a drain of the MOSFET 42. The MOSFET 42 has its source connected to a ground terminal. The MOSFETs 41 and 42 constitute a CMOS inverter. The MOSFET 42 has its gate receiving a word line selecting signal. The MOSFET 41 has its gate receiving a signal obtained by inverting the word line selecting signal by the inverter 43. A node of the source of the MOSFET 41 and the drain of the MOSFET 42 is connected to a corresponding one of word lines 16a to 16n.

According to the present embodiment, a potential at the time of selecting a word line is lower, by a threshold voltage of the MOSFET 41, than a potential $V_G$ of a gate of the MOSFET 41. More specifically, a potential of a high level on the word line can be freely set by selecting a threshold voltage of the inverter 43.

Thus, when the potential of a high level on the word line is selected such that the difference between a potential on a bit line to which data at a high level is read out at the time of reading out data and a potential on the word line is sufficiently small, a sub-threshold current flowing in an accessing MOSFET becomes sufficiently small. As a result, in the present embodiment, the static RAM is immune to soft errors, as in the embodiment shown in FIG. 4.

Additionally, means for reducing the potential at the time of selecting a word line is not limited to the means in the above described embodiment. Another means may be used in which the condition $I_{sub} << I_L$ is satisfied.

Figure 6:
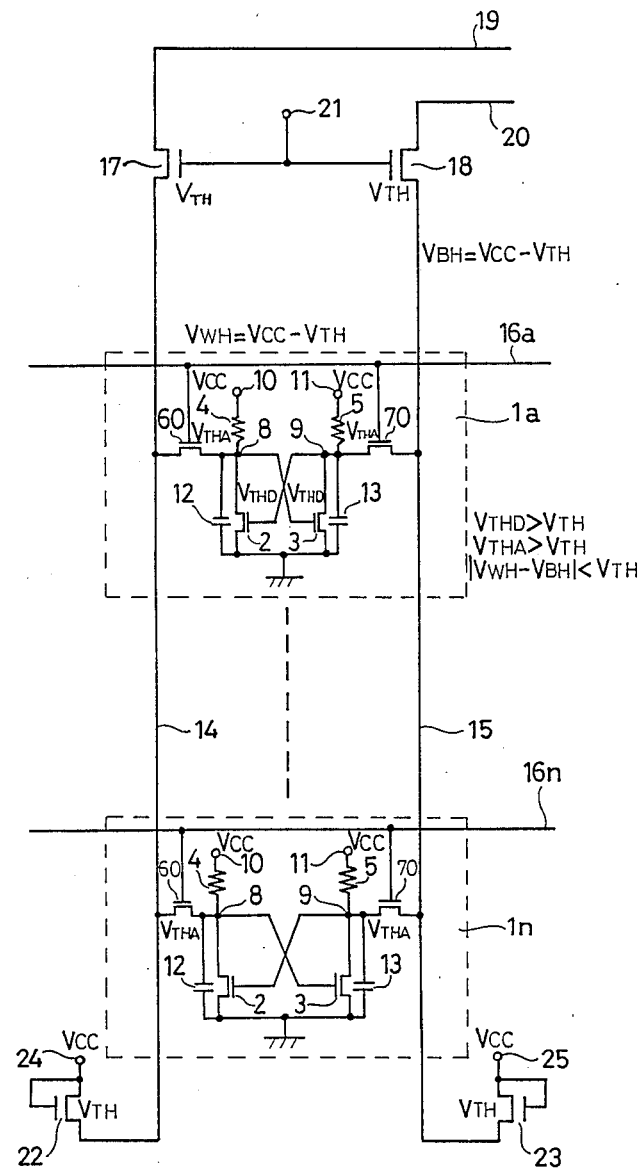
FIG. 6 is a circuit diagram showing a memory cell portion of a static RAM according to still another embodiment of the present invention.

FIG. 6 is a circuit diagram showing a memory cell portion of a static RAM according to still another embodiment of the present invention.

Instead of reducing the potential at the time of selecting a word line as shown in FIGS. 4 and 5, in the present embodiment, MOSFETs 60 and 70 each having a high threshold voltage $V_{THA}$ are used as an accessing transistor connected between a node 8 and a bit line 14 and between a node 9 and a bit line 15.

For example, when a threshold voltage $V_{THB}$ of bit line load constituting MOSFETs 22 and 23 is 1.5V, a threshold voltage $V_{THA}$ of the accessing MOSFETs 60 and 70 is set to 2 V. In this case, assuming that a power-supply voltage $V_{CC}$ is 5 V, a potential on the bit line to which data of a high level is read out is $5 - 1.5 = 3.5$ V. Thus, a voltage between a gate and a source of each of the accessing MOSFETs 60 and 70 is $5 - 3.5 + 1.5$ V, which is lower than the threshold voltage $V_{THA} (= 2$ V) of the accessing MOSFETs 60 and 70.

Figure 7:
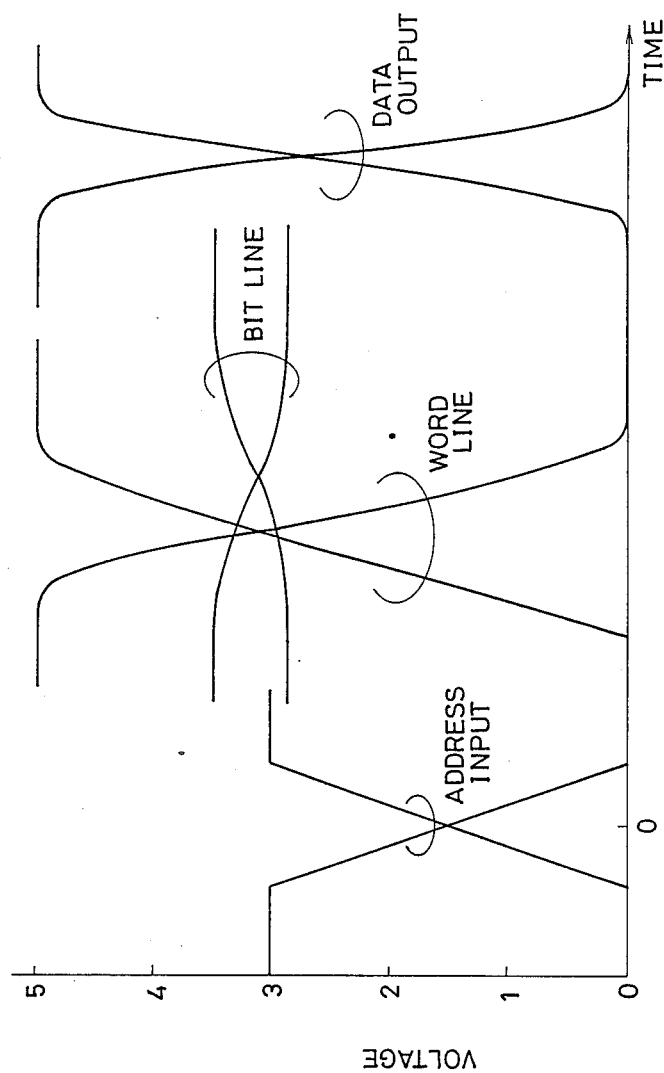
FIG. 7 is a waveform diagram showing operation of the static RAM shown in FIG. 6.

FIG. 7 illustrates a waveform of operation according to the present embodiment. Referring to FIG. 7, when an address input is applied, one of word lines 16a to 16n (for example, 16a) is selected in response to the address input, so that a potential on the selected word line 16a rises from 0 V to 5 V. Thus, data stored in the nodes 8 and 9 in the memory cell 1a connected to the word line 16a are read out to the bit lines 14 and 15, respectively. As a result, the potential difference occurs between the bit lines 14 and 15. The potential difference is amplified by a sense amplifier, so that a data output of 0V or 5V is obtained.

According to the present embodiment, since the threshold voltage $V_{THA}$ of the accessing MOSFETs 60 and 70 is larger than the difference between the potential on the bit line to which data of a high level is read out and the potential on the word line, the sum $I_{sub}$ of a sub-threshold current $I_{subA}$ flowing in the accessing MOSFETs 60 or 70 and a sub-threshold current $I_{subB}$ flowing in the inverter constituting MOSFET 2 or 3 becomes sufficiently smaller than current ability $I_L$ supplied by the memory cell ($I_{sub} << I_L$). Thus, a potential of a node having high-level data stored therein is not decreased by the sub-threshold current $I_{sub}$.

The threshold voltage of the accessing MOSFETs 60 and 70 can be freely set by ion implantation, selection of the concentration of a substrate, or the like in consideration of the value of a load resistance in the memory cell. If the threshold voltage of the accessing MOSFETs 60 and 70 is increased, the resistance value at the time of conduction of the MOSFETs 60 and 70 is increased, so that the access time may be increased. However, this can be avoided by increasing the channel width.

Additionally, instead of increasing the threshold voltage of the accessing transistors as shown in the above described embodiment, the threshold voltage of the bit line load constituting MOSFETs 22 and 23 may be decreased. In this case, since a potential on the bit line to which a high-level data is read out at the time of selecting a word line is increased, the difference between the potential on the word line and the potential on the bit line becomes smaller than the threshold voltage of the accessing transistors, so that a sub-threshold current flowing in the accessing transistors becomes substantially small. Means for increasing the potential on the bit line is not limited to the above described means. Another means may be used, to obtain the same effect. For example, if a bit line load comprises a resistance or a depletion transistor, the potential on the bit line is charged to be the power-supply potential. In addition, the threshold voltage of the accessing transistors may be set high separately from that of the inverter constituting transistor or set to be the same value as that of the inverter constituting transistor. The static RAM has the advantage of providing greater freedom in design if the threshold voltages are set to different values and of the reduced number of processes if the threshold voltages are set to the same value.

Description is now made on the relation between a sub-threshold current and the decrease in potential of a node using specific numerical values.

Figure 8:
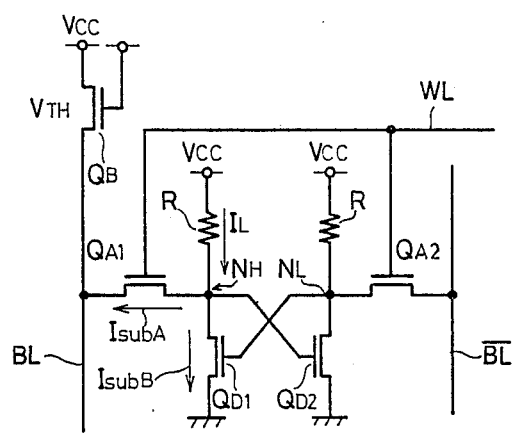
FIG. 8 is a circuit diagram for explaining the decrease in potential of a node in a memory cell, by a sub-threshold current.

In FIG. 8, it is assumed that information of a high level is stored in a node $N_H$ and information of a low level is stored in a node $N_L$. In addition, it is assumed that the resistance value of a load resistance R is 500 GΩ ($5 \times 10^{11} \Omega$) and a power-supply potential $V_{CC}$ is 5 V. When a potential on a word line WL is at a low level, MOSFETs $Q_{A1}$ and $Q_{A2}$ are completely off, so that sub-threshold currents $I_{subA}$ and $I_{subB}$ have substantially small values ($I_{subA}+I_{subB}=10^{-13}$A or less). Furthermore, a load current $I_L$ flowing in the load resistance R has the same value. Thus, a potential $V_{NH}$ of the node $N_H$ is as follows:

$$V_{NH} = V_{CC} - R \cdot I_L = 5 - (5 \times 10^{-2}) \approx 5$$

Namely, the potential $V_{NH}$ becomes a value substantially close to the power-supply potential $V_{CC}$.

Figure 1:
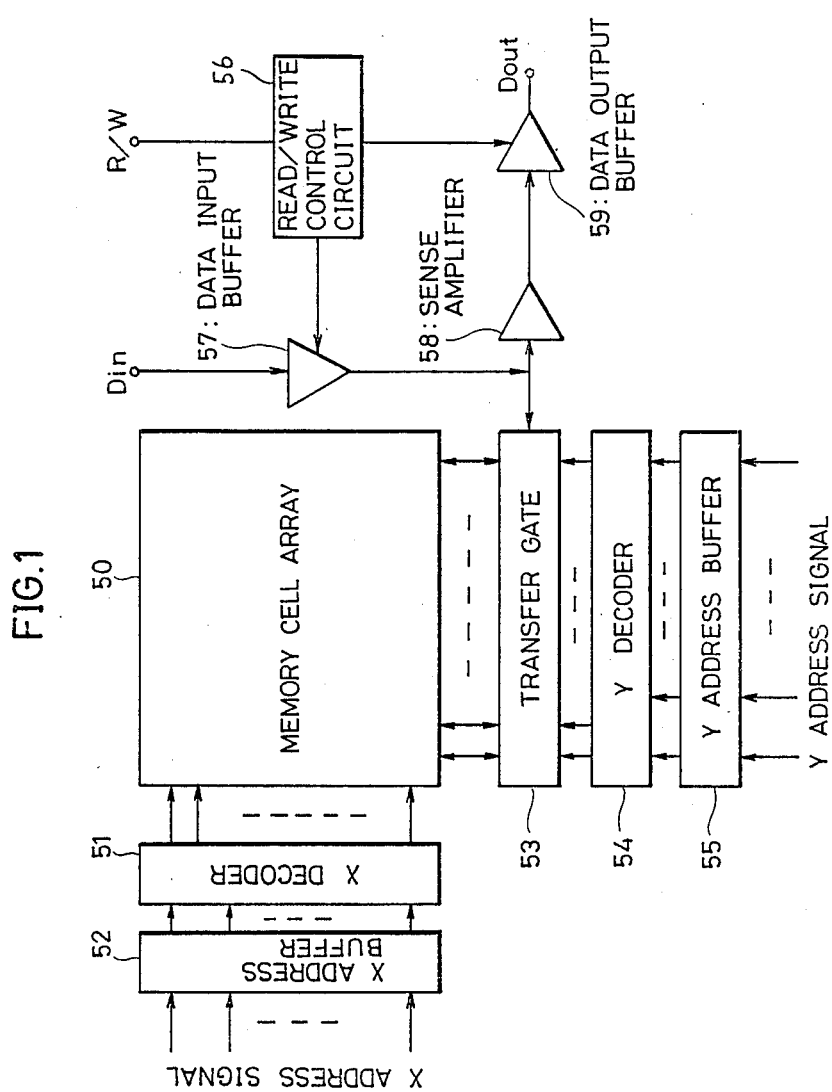
FIG. 1 is a block diagram showing entire structure of a static RAM.
Figure 2:
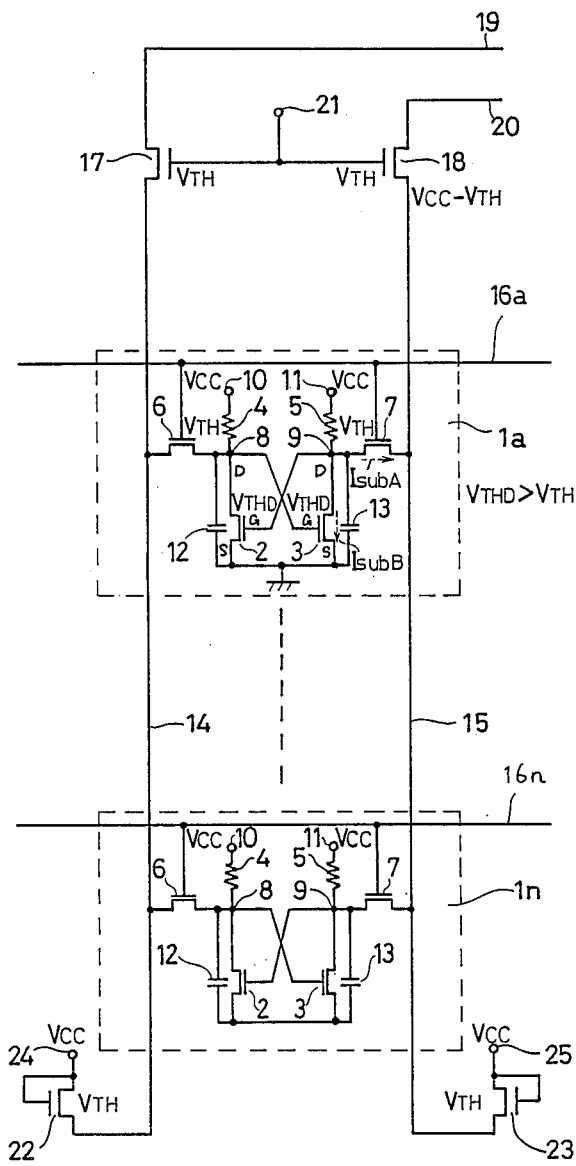
FIG. 2 is a circuit diagram showing a memory cell portion of a conventional static RAM.
Figure 3:
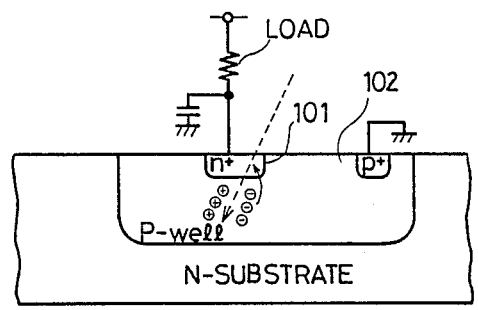
FIG. 3 is a diagram for explaining a mechanism of soft errors.

When the potential on the word line WL attains a high level, the sub-threshold current $I_{sub}$ ($=I_{subA}+I_{subB}$) flowing in the MOSFETs $Q_{A1}$ and $Q_{D1}$ is increased by several figures, in the case of the conventional example shown in FIG. 2. For example, the sub-threshold current $I_{sub}$ is approximately as follows:

$$I_{sub} = I_{subA} + I_{subB} \approx 10^{-9}\text{A}$$

Figure 9:
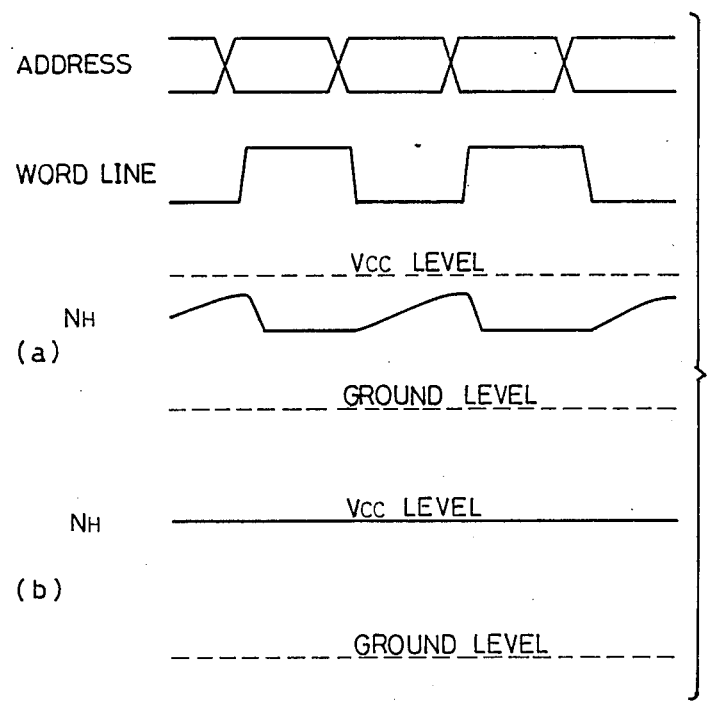
FIG. 9 comprised of parts (a) and (b) is a timing chart showing the decrease in potential in a memory cell, by a sub-threshold current.

Since the load current $I_L$ equals the sub-threshold current $I_{sub}$, the potential $V_{NH}$ of the node $N_H$ attempts to be lowered by $R \cdot I_L$ ($=5 \times 10^{11} \times 1 \times 10^{-9}$). In this case, however, since a potential on a bit line BL is held at a potential which is lower, by a threshold voltage $V_{TH}$ of an MOSFET $Q_B$, than the power-supply potential $V_{CC}$, the potential $V_{NH}$ of the node $N_H$ equals the potential on the bit line BL. For example, when the threshold voltage $V_{TH}$ of the MOSFET $Q_B$ is 1.5 V, the potential $V_{NH}$ of the node $N_H$ is lowered to $5-1.5=3.5$ V. When the potential on the word line WL attains a low level, the potential $V_{NH}$ is charged again by the load resistance R, to be restored to a potential almost close to $V_{CC}$ with a long time constant (approximately 10 ms). However, as shown in FIG. 9(a), when the word line WL is selected until the potential $V_{NH}$ of the node $N_H$ rises to the power-supply potential $V_{CC}$, the soft error rate is increased.

Thus, in order to improve soft error immunity, it is necessary that the potential $V_{NH}$ of the node $N_H$ is not so lowered at the time of selecting the word line WL (at the time of a high level). In order to lower the potential $V_{NH}$ by approximately 0.1 V at that time of selecting the word line WL, the current $I_L$ must have the following value:

$$I_L = 0.1/5 \times 10^{11} = 2 \times 10^{-13}\text{A}$$

Figure 10:
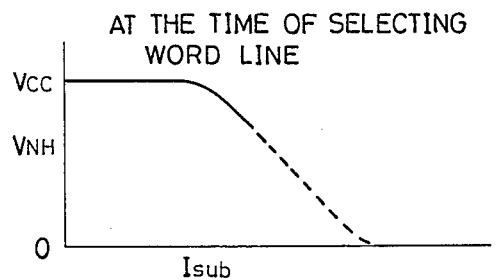
FIG. 10 is a diagram showing the relation between the sub-threshold current and potential of the node.

Thus, the sub-threshold current $I_{sub}$ ($=I_{subA}+I_{subB}$) must be made $2 \times 10^{-13}$A or less. Since the sub-threshold current $I_{subA}$ is decreased by approximately one figure when the threshold voltages of the MOSFETs $Q_{A1}$ and $Q_{A2}$ are raised by 0.1 V, the amount of the rise in the threshold voltages can be estimated. If $I_{sub} \approx 10^{-9}$A, then $I_{sub} \approx 10^{-13}$A when the threshold voltages of the MOSFETs $Q_{A1}$ and $Q_{A2}$ are raised by 0.4 V. As a result, the amount of the decrease in potential of the node $N_H$ becomes 0.1V at the time of selecting the word line WL, so that the soft error rate is improved by approximately one figure or more. FIG. 10 is a diagram showing the concept of the relation between the sub-threshold current $I_{sub}$ and the potential $V_{NH}$ of the node $N_H$ at the time of selecting the word line WL. This diagram shows that the potential $V_{NH}$ of the node $N_H$ is lowered as the sub-threshold current $I_{sub}$ increases.

Description is now made on the transient change of the sub-threshold current $I_{sub}$ and the load current $I_L$ at the time of selecting the word line WL. Let's consider the case in which the potential on the word line WL rises to a high level so that the potential of the node $N_H$ is lowered to 4.5 V. When the potential on the word line WL attains a high level, the sub-threshold current $I_{sub}$ first increases. As a result, the sub-threshold current $I_{sub}$ and the load current $I_L$ have the relation $I_{sub} > I_L$. Thus, the load current $I_L$ also increases, so that the potential $V_{NH}$ of the node $N_H$ is lowered with increasing the load current $I_L$. When the potential $V_{NH}$ is lowered to 4.5 V, the sub-threshold current $I_{sub}$ and the load current $I_L$ become equal, so that the potential $V_{NH}$ is not lowered any more. More specifically, so long as the relation $I_{sub} > I_L$ holds, the potential $V_{NH}$ of the node $N_H$ continues to be lowered.

Let's consider the case in which the potential $V_{NH}$ of the node $N_H$ is stabilized at 4.9 V when the potential on the word line WL rises to a high level. When the potential on the word line WL attains a high level, the sub-threshold current $I_{sub}$ first increases, so that the relation $I_{sub} > I_L$ holds. Correspondingly, the load current $I_L$ increases, so that the potential $V_{NH}$ is lowered to 4.9 V. At this time point, if the relation $I_{sub} = I_L$ holds, the potential $V_{NH}$ is now lowered any more. If the relation $I_{sub} < I_L$ is satisfied when the potential $V_{NH}$ of the node $N_H$ becomes lower than 4.9 V for some reason, the load current $I_L$ is decreased to be equal to the sub-threshold current $I_{sub}$. As a result, the potential $V_{NH}$ of the node $N_H$ is raised to 4.9 V. Thus, the potential $V_{NH}$ of the node $N_H$ is stabilized at 4.9 V.

As described in the foregoing, if the relation $I_{sub} > I_L$ holds at the time of selecting a word line, the potential $V_{NH}$ of the node $N_H$ continues to be lowered. On the other hand, if the relation $I_{sub} < I_L$ holds, the potential $V_{NH}$ of the node $N_H$ is not decreased any more. More specifically, it is assumed that the soft error rate is improved if the amount of the decrease in potential of the node $N_H$ at the time of selecting the word line is $\Delta V$ or less. In this case, if the relation $I_{sub} < I_L$ holds at the time point at which the potential $V_{NH}$ of the node $N_H$ is $V_{CC} - \Delta V$, the potential $V_{NH}$ is now lower than $V_{CC} - \Delta V$.

Figure 11:
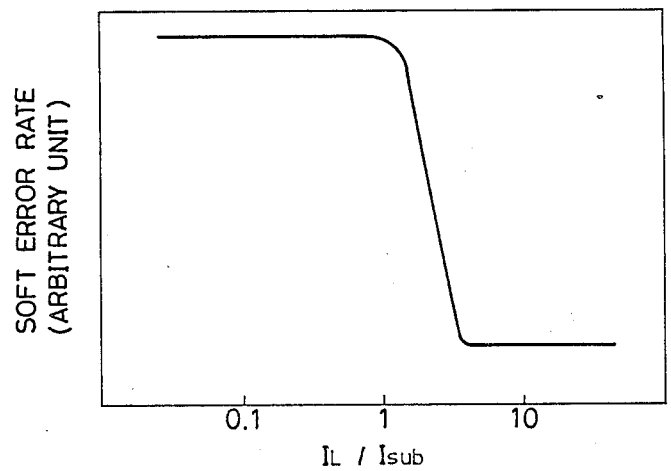
FIG. 11 is a diagram showing the concept of the relation between the ratio $I_L/I_{sub}$ of a load current to the sub-threshold current and a soft error rate.

FIG. 11 is a diagram showing the relation between $I_L/I_{sub}$ and the soft error rate at the time point at which the potential $V_{NH}$ of the node $N_H$ is $V_{CC} - \Delta V$. As shown in FIG. 10, if the relation $I_L/I_{sub} < 1$ holds, the potential $V_{NH}$ of the node $N_H$ becomes lower than $V_{CC} - \Delta V$, so that the soft error rate is increased. On the other hand, if the relation $I_L/I_{sub} > 1$ holds, the potential $V_{NH}$ of the node $N_H$ becomes higher than $V_{CC} - \Delta V$, so that the soft error rate is decreased. Thus, if a potential at the time of selecting a word line, a potential on a bit line or a threshold voltage of an MOSFET is set in the above described embodiment such that the relation $I_L/I_{sub} >$ holds at the time point at which the potential $V_{NH}$ of the node $N_H$ is lowered to $V_{CC} - \Delta V$, the soft error rate can be significantly improved.

More specifically, the threshold voltages of the MOSFETs or the value of the load resistances are set such that not only the accessing MOSFET and the inverter constituting MOSFET connected to the node $V_{NH}$ are turned off in a usual sense, but also a potential of the node $N_H$ is stabilized at a potential sufficiently higher than a potential of a potential on the word line minus the threshold voltage of the accessing MOSFET, at the time of reading out data.

In order to stabilize a potential of the node $N_H$ as described above, one or some of the following adjustment ① ~ ① are made; ① an adjustment of the threshold voltage $V_{THW}$ of the MOSFET 31 in the word line driver; ② an adjustment of the threshold voltage of the inverter 43 in the word line driver; ③ an adjustment of the threshold voltage $V_{THA}$ of the accessing MOSFETs 60 and 70; ④ an adjustment of the threshold voltage $V_{THD}$ of the inverter constituting MOSFETs 2 and 3; ⑤ an adjustment of the bit line load constituting MOSFETs 17 and 18; ⑥ an adjustment of the value of the load resistances 4 and 5.

Additionally, decrease in potential of a node $N_H$ can be prevented by increasing the ratio of a gate width of the accessing MOSFETs 60 and 70 to a gate width of the inverter constituting MOSFETs 2 and 3 so that a potential of a node in which an information of a low level is stored is made to be decreased.

Meanwhile, in the case of adjusting the value R of the load resistances 4 and 5, the value R is set to be sufficiently smaller than (the power supply potential $V_{CC}$ - the threshold voltage $V_{TH}$ of the accessing MOSFET)-/$I_{leak}$: where $I_{leak}$ represents the sum of the leak currents which flow to the bit line and to the ground terminal from a node in which information of a high level is stored when the power supply potential $V_{CC}$ is applied to the node.

Furthermore, consider the case where the threshold voltage $V_{TH}$ of the bit line load constituting MOSFETs 17 and 18 is set to be smaller than the threshold voltage of the MOSFETs in the memory cell. In this case, if threshold voltages of MOSFETs in a peripheral circuit are set to more than two values, one threshold voltage of the MOSFETs may be set to the same threshold voltage as the bit line load constituting MOSFETs 17 and 18 and the other one threshold voltage of the MOSFETs may be set to the same threshold voltage as the MOSFETs in the memory cell. As a result, the number of processing can be reduced.

More specifically, in the case of setting the threshold voltage of the accessing MOSFETs and the inverter constituting MOSFETs to be higher, a junction capacitance is increased so that immunity to soft errors can be strengthened since P-type impurities are implanted under a channel of each MOSFET.

Additionally, in the case of setting a potential on the word line at the time of selecting to be lower than the supply potential $V_{CC}$, amplitude of the potential on the word line becomes smaller. Thus, switching among the word lines can be made faster, so that access time can be shortened.

Although the present invention has been described and illustrate in detail, it is clearly understood that the same is by way of illustration and example only and is not to be taken by way of limitation, the spirit and scope of the present invention being limited only by the terms of the appended claims.

What is claimed is:

1. A static random access memory having a reduced soft error rate, comprising:
   a plurality of word lines,
   a plurality of bit line pairs arranged intersecting with said plurality of word lines,
   a plurality of memory cells each connected to an intersection of each of said word lines and each of said bit line pairs,
   a potential source for generating a power-supply potential and a ground potential, and
   word line selecting means for selecting a single word line from among said plurality of word lines and applying a predetermined potential to the word line,
   each of said memory cells comprising
      a first load element having one terminal coupled to said power-supply potential and another terminal in which information of a low or high level is stored,
      a second load element having one terminal coupled to said power-supply potential and another terminal in which information of a high or low level is stored,
      a first information storing transistor element connected between the other terminal of said first load element and said ground potential and having a control terminal connected to the other terminal of said second load element,
      a second information storing transistor element connected between the other terminal of said second load element and said ground potential and having a control terminal connected to the other terminal of said first load element,
      a third accessing transistor element connected between one of each of said bit line pairs and the other terminal of said first load element and having a control terminal connected to a corresponding one of said word lines, and
a fourth accessing transistor element connected between the other of each of said bit line pairs and the other terminal of said second load element and having a control terminal connected to a corresponding one of said word lines,
said third and fourth accessing transistor elements having a first threshold voltage, and
potential establishing means for setting the potential difference between a potential on the word line selected by said word line selecting means and a potential on a bit line to which information of a high level is read out at the time of selecting the word line to be smaller than said first threshold voltage of said third and fourth transistor elements so that soft errors are reduced.

2. A static random access memory having a reduced soft error rate, comprising:
a plurality of word line,
a plurality of bit line pairs arranged intersecting with said plurality of word lines,
a plurality of memory cells each connected to an intersection of each of said word lines and each of said bit line pairs,
a potential source for generating a power-supply potential and a ground potential, and
word line selecting means for selecting a single word line from among said plurality of word lines and applying a predetermined potential to the word line,
each of said memory cells comprising
a first load element having one terminal coupled to said power-supply potential and another terminal in which information of a low or high level is stored,
a second load element having one terminal coupled to said power-supply potential and another terminal in which information of a high or low level is stored,
a first information storing transistor element connected between the other terminal of said first load element and said ground potential and having a control terminal connected to the other terminal of said second load element,
a second information storing transistor element connected between the other terminal of said second load element and said ground potential and having a control terminal connected to the other terminal of said first load element,
a third accessing transistor element connected between one of each of said bit line pairs and the other terminal of said first load element and having a control terminal connected to a corresponding one of said word lines, and
a fourth accessing transistor element connected between the other of each of said bit line pairs and the other terminal of said second load element and having a control terminal connected to a corresponding one of said word lines,
said third and fourth transistor elements having a first threshold voltage,
said first transistor element and said second transistor element having a second threshold voltage larger than the potential difference between a potential of said other terminal of said first or second load element having said information of a low level stored therein at a time of selecting the word line and said ground potential, and
potential establishing means for setting the potential difference between a potential on the word line selected by said word line selecting means and a potential on a bit line to which information of a high level is read out at the time of selecting the word line to be smaller than said first threshold voltage of said third and fourth transistor elements so that soft errors are reduced.

3. A static random access memory according to claim 1, wherein
said potential establishing means comprises means for adjusting said predetermined potential on the selected word line.

4. A static random access memory according to claim 2, wherein
said potential establishing means comprises means for adjusting said predetermined potential on the selected word line.

5. A static random access memory according to claim 4, wherein
said word line selecting means comprises an address decoder responsive to an address signal for applying a selecting signal to one of said word lines, and
said potential establishing means comprises potential setting means for setting a potential of said selecting signal to a predetermined potential.

6. A static random access memory according to claim 5, wherein said potential setting means comprises
a CMOS inverter comprising an input terminal receiving said selecting signal, an output terminal connected to a corresponding one of said word lines, a first supply terminal, and a second supply terminal receiving said ground potential, and
voltage dropping means connected between said power-supply potential and said first supply terminal in said CMOS inverter.

7. A static random access memory according to claim 6, wherein
said CMOS inverter comprises
a first P channel MOS field effect transistor comprising a gate terminal receiving said selecting signal, one conduction terminal, and another conduction terminal connected to a corresponding one of said word lines, and
a second N channel MOS field effect transistor comprising a gate terminal receiving said selecting signal, one conduction terminal receiving said ground potential, and another conduction terminal connected to a corresponding one of said word lines,
said voltage dropping means comprises a third N channel MOS field effect transistor comprising a gate terminal connected to said power-supply potential, one conduction terminal connected to said one conduction terminal of said first MOS field effect transistor, and another conduction terminal connected to said power-supply potential.

8. A static random access memory according to claim 6, wherein said potential setting means comprises
a first MOS field effect element of a first conductivity channel type comprising a gate terminal receiving said selecting signal, one conduction terminal receiving said ground potential, and another conduction terminal connected to a corresponding one of said word lines, inverter means comprising an input terminal receiving said selecting signal and an output terminal responsive to said selecting signal for outputting a predetermined potential lower than said power-supply potential, and a second MOS field effect element of the first conductivity channel type comprising a gate terminal connected to the output terminal of said inverter means, one conduction terminal connected to a corresponding one of said word lines, and another conduction terminal receiving said power-supply potential.

9. A static random access memory according to claim 1, wherein said potential establishing means comprises means for adjusting said first threshold voltage of said third and fourth transistor elements.

10. A static random access memory according to claim 2, wherein said potential establishing means comprises means for adjusting said first threshold voltage of said third and fourth transistor elements.

11. A static random access memory according to claim 10, which further comprises bit line load constituting elements each connected between each of said bit lines and said power-supply potential and having a third threshold voltage, said first threshold voltage of said third and fourth transistor elements being larger than said third threshold voltage of said bit line load constituting elements.

12. A static random access memory according to claim 1, wherein said first, second, third and fourth transistor elements comprise an MOS field effect transistor.

13. A static random access memory according to claim 2, wherein said first, second, third and fourth transistor elements comprise an MOS field effect transistor.

14. A static random access memory according to claim 11, wherein said bit line load constituting elements comprise an MOS field effect element.

15. A static random access memory according to claim 14, wherein said MOS field effect element comprises an MOS field effect transistor.

16. A static random access memory according to claim 1, wherein a load current $I_L$ flowing in said first or second load element and the sum $I_{sub}$ of a sub-threshold current flowing in said first or second transistor element connected to the load element and a sub-threshold current flowing in said third or fourth transistor element connected to the load element satisfy the relation $I_L > I_{sub}$ when a potential of said other terminal of said first or second load element in which said information of a high level is stored is a predetermined potential having a reduced soft error rate in the memory cell connected to the selected word line at the time of selecting said word lines.

17. A static random access memory according to claim 2, wherein a load current $I_L$ flowing in said first or second load element and the sum $I_{sub}$ of a sub-threshold current flowing in said first or second transistor element connected to the load element and a sub-threshold current flowing in said third or fourth transistor element connected to the load element satisfy the relation $I_L > I_{sub}$ when a potential of said other terminal of said first or second load element in which said information of a high level is stored is a predetermined potential having a reduced soft error rate in the memory cell connected to the selected word line at the time of selecting said word lines.

18. A static random access memory according to claim 1, wherein said potential establishing means sets the potential difference between a potential on the selected word line and a potential on a bit line to which information of a high level is read out such that a potential of said another terminal in which information of a high level is stored is stabilized at a potential higher than a potential which is lower than the potential on the selected word line by said first threshold voltage of said third and fourth accessing transistor elements.

19. A static random access memory according to claim 2, wherein said second threshold voltage is set such that a potential of said another terminal in which information of a high level is stored is stabilized at a potential higher than a potential which is lower than the potential on the selected word line by said first threshold voltage of said third and fourth accessing transistor elements.

20. A static random access memory according to claim 5, wherein said potential setting means sets the potential of said selecting signal such that a potential of said another terminal in which information of a high level is stored is stabilized at a potential higher than a potential which is lower than the potential on the selected word line by said first threshold voltage of said third and fourth accessing transistor elements.

21. A static random access memory according to claim 10, wherein said first threshold voltage of said third and fourth transistor elements is set such that a potential of said another terminal in which information of a high level is stored is stabilized at a potential higher than a potential which is lower than the potential on the selected word line by said first threshold voltage of said third and fourth accessing transistor elements.

22. A static random access memory according to claim 1, wherein said first and second load elements have resistance value which is set such that a potential of said another terminal in which information of a high level is stored is stabilized at a potential higher than a potential which is lower than the potential on the selected word line by said first threshold voltage of said third and fourth accessing transistor elements.

* * * * *